United States Patent
Tan et al.

(10) Patent No.: US 12,146,220 B2
(45) Date of Patent: Nov. 19, 2024

(54) APPARATUS AND METHOD FOR MANUFACTURING SEMICONDUCTOR FILM

(71) Applicant: Piotech Inc., Shenyang (CN)

(72) Inventors: Huaqiang Tan, Shenyang (CN);
Mingce Huang, Shenyang (CN);
Tingting Zhao, Shenyang (CN);
Jingshu Li, Shenyang (CN)

(73) Assignee: Piotech Inc., Shenyang (CN)

( * ) Notice: Subject to any disclaimer, the term of this patent is extended or adjusted under 35 U.S.C. 154(b) by 526 days.

(21) Appl. No.: 17/485,735

(22) Filed: Sep. 27, 2021

(65) Prior Publication Data

US 2022/0205102 A1 Jun. 30, 2022

(30) Foreign Application Priority Data

Dec. 31, 2020 (CN) .......................... 202011642967.1

(51) Int. Cl.
*C23C 16/455* (2006.01)
*C23C 16/52* (2006.01)

(52) U.S. Cl.
CPC ........ *C23C 16/45587* (2013.01); *C23C 16/52* (2013.01)

(58) Field of Classification Search
None
See application file for complete search history.

(56) References Cited

U.S. PATENT DOCUMENTS

| 11,101,114 B2* | 8/2021 | Hosaka ............. C23C 16/45589 |
| 11,804,366 B2* | 10/2023 | Hosaka ............. H01J 37/32834 |
| 2009/0145356 A1* | 6/2009 | Lai ........................ F26B 21/004 |
| | | 118/305 |
| 2013/0239894 A1 | 9/2013 | Fang et al. |
| 2013/0298836 A1* | 11/2013 | Ikenaga ............ H01L 21/68771 |
| | | 118/730 |
| 2016/0230276 A1* | 8/2016 | Aboagye ............. C23C 16/4584 |
| 2018/0005856 A1* | 1/2018 | Chang ............... H01L 21/67115 |

FOREIGN PATENT DOCUMENTS

| CN | 202047131 U | 11/2011 |
| CN | 104995717 B | 12/2017 |
| TW | 201340252 A | 10/2013 |

OTHER PUBLICATIONS

First Office Action issued in corresponding Taiwan Application No. 110124158 dated Aug. 15, 2022.

* cited by examiner

*Primary Examiner* — Jethro M. Pence
(74) *Attorney, Agent, or Firm* — Blank Rome LLP

(57) ABSTRACT

The present application provides an apparatus and a method for manufacturing a semiconductor film. The apparatus includes: a chamber; a spray board arranged at a top of the chamber; a wafer pocket arranged opposite to the spray board in the chamber; and a pumping part arranged close to an inner side wall of the chamber.

18 Claims, 7 Drawing Sheets

APPARATUS AND METHOD FOR MANUFACTURING SEMICONDUCTOR FILM

CROSS-REFERENCE TO RELATED APPLICATIONS

This application claims priority to Chinese Patent Application No. 202011642967.1 filed on Dec. 31, 2020, and all the benefits accruing therefrom under 35 U.S.C. § 119, the contents of which in its entirety are herein incorporated by reference.

BACKGROUND OF THE INVENTION

1. Field of the Invention

The present application generally relates to semiconductor manufacturing technologies, and more specifically, to apparatuses and methods for manufacturing a semiconductor film.

2. Description of the Related Art

A semiconductor process may include film deposition processing, such as atomic layer deposition (ALD) and plasma enhanced chemical vapor deposition (PECVD), which is used for forming various films on a wafer or a substrate to manufacture a semiconductor device. In the film deposition processing, a thickness of a profile of a semiconductor film is one of key technical indexes of a semiconductor film deposition process.

Generally, a semiconductor film deposition apparatus uses a pumping apparatus to exhaust gas in a reaction chamber to control a deposition process, thereby generating a semiconductor film with a desirable thickness. However, a pumping system of the current semiconductor film deposition apparatus can only effectively control a thickness of a center region of the film, and is incapable of controllably adjusting an edge trend of the profile of the film.

SUMMARY OF THE INVENTION

According to one aspect, the present application provides a film deposition apparatus. The apparatus may include: a chamber; a spray board arranged at a top of the chamber; a wafer pocket arranged opposite to the spray board in the chamber; and a pumping part arranged close to an inner side wall of the chamber, where the pumping part is configured to ascend or descend in the chamber under driving of a first motor.

In some embodiments, the pumping part may be annular.

In some embodiments, a plurality of pumping holes may be provided on an inner surface of the pumping part, and the plurality of pumping holes are generally distributed along a circumference of the inner surface.

In some embodiments, the film deposition apparatus may further include a pumping pipe, where the pumping pipe is partially located in the chamber and is connected to the pumping part, and the pumping pipe is in communication with the interior of the pumping part.

In some embodiments, the film deposition apparatus may further include a pumping base plate, where the pumping part is arranged on the pumping base plate, and the pumping base plate is fixedly connected to the pumping pipe and is provided with a hole corresponding to the pumping pipe.

In some embodiments, the pumping base plate may be connected to a fixing flange through a screw, and the fixing flange may be connected to the pumping pipe through a flange screw.

In some embodiments, the film deposition apparatus may further include a lead screw connected to the first motor and a slider assembled on the lead screw, where the slider is fixedly connected to the pumping pipe.

In some embodiments, the slider may be connected to the pumping pipe through a fixing part.

In some embodiments, the film deposition apparatus may further include a support bar, where the support bar is partially located in the chamber and is connected to the pumping part, and the support bar is not in communication with the interior of the pumping part.

In some embodiments, the film deposition apparatus may further include a lead screw connected to a second motor and a slider assembled on the lead screw, where the slider is fixedly connected to the support bar.

In some embodiments, the second motor may be configured to run generally synchronously with the first motor.

In some embodiments, the pumping part may be configured to move to be located above or below the wafer pocket, or to be located in a same horizontal plane with the wafer pocket under the driving of the first motor.

In some embodiments, the pumping part may be configured to make an upper surface of the pumping part close to a lower surface of the spray board under the driving of the first motor.

In some embodiments, the pumping part may be configured to make a lower surface of the pumping part close to a bottom surface of the chamber under the driving of the first motor.

In some embodiments, the wafer pocket may be configured to ascend or descend in the chamber under driving of a third motor.

According to another aspect, the present application provides a method of operating the film deposition apparatus according to any embodiment of the present application, and the method may include: placing a wafer on the wafer pocket of the film deposition apparatus; providing, in the chamber of the film deposition apparatus by using the spray board of the film deposition apparatus, reaction gas used for depositing a film on the wafer; and adjusting a height of the pumping part of the film deposition apparatus in the chamber by controlling the first motor.

In some embodiments, a working position of the wafer pocket may be maintained unchanged while the height of the pumping part in the chamber is adjusted.

In some embodiments, adjusting the height of the pumping part in the chamber may include adjusting the height of the pumping part in the chamber to cause the pumping part to move to be located above or below the wafer pocket, or to be located in a same horizontal plane with the wafer pocket.

In some embodiments, adjusting the height of the pumping part in the chamber may include adjusting the height of the pumping part in the chamber to make the upper surface of the pumping part close to the lower surface of the spray board.

In some embodiments, adjusting the height of the pumping part in the chamber may include adjusting the height of the pumping part in the chamber to make the lower surface of the pumping part close to the bottom surface of the chamber.

In some embodiments, adjusting the height of the pumping part in the chamber may include adjusting the height of the pumping part in the chamber while adjusting a working position of the wafer pocket synchronously, to make relative positions between the wafer pocket and the pumping part substantially unchanged.

Details of one or more examples of the present application are described in the following accompanying drawings and description. Other features, objectives, and advantages will be apparent from the description, the accompanying drawings, and the claims.

BRIEF DESCRIPTION OF THE DRAWINGS

Content disclosed in this specification mentions and includes the following figures.

Figure 1:
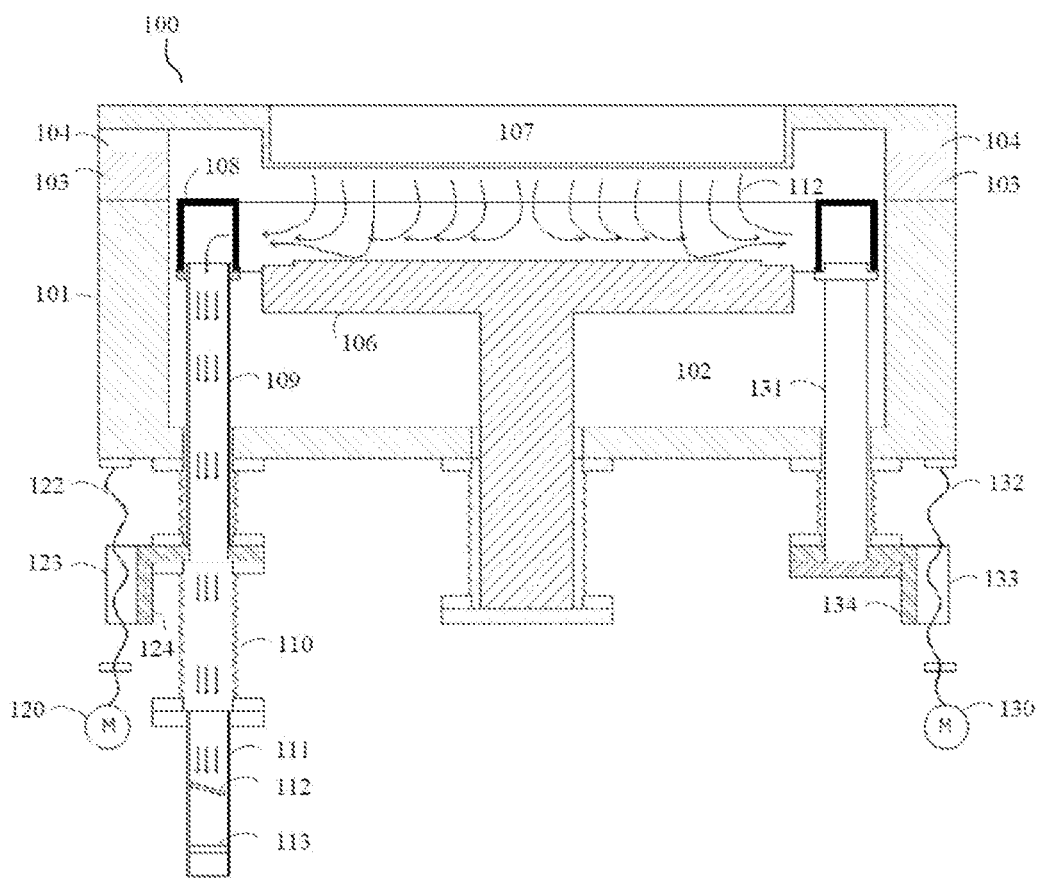
FIG. 1 is a schematic structural diagram of a film deposition apparatus according to some embodiments of the present application.

According to common practice, various features described in the figures may not be drawn to scale. Therefore, the sizes of the various features may be increased or reduced arbitrarily for the purpose of clear description. Shapes of the parts described in the figures are only exemplary, and are not intended to limit actual shapes of the parts. In addition, for clear description, an implementation solution described in the figures may be simplified. Therefore, the figures may not describe all components of a given device or apparatus. Finally, same reference numerals may be used to represent same features throughout the specification and figures.

PREFERRED EMBODIMENT OF THE PRESENT INVENTION

To better understand the spirit of the present application, the spirit of the present application is further described with reference to some embodiments of the present application.

Terms "in an embodiment" or "according to an embodiment" used in this specification may not necessarily refer to a same specific embodiment, and "in (some) other embodiments" or "according to (some) other embodiments" used in this specification may not necessarily refer to different specific embodiments. The objective is that, for example, a claimed subject includes a combination of all or some exemplary specific embodiments. Meanings of "above" and "below" indicated in this specification are not limited to a relationship directly presented in the figures, but may include description of an explicit correspondence, such as a relationship between "left" and "right", or an opposite relationship between "above" and "below". The "connecting" mentioned in this specification should be understood as including "direct connecting" and "connecting through one or more intermediate parts". Names of various parts used in this specification are merely for the purpose of description and do not have a limitation function, and different manufacturers may use different names to represent components having the same function.

Various implementations of the present application are discussed below in detail. Although specific implementations are discussed, it should be understood that these implementations are merely used for the purpose of illustration. A person skilled in the related art may know that, other parts and configurations may be used without departing from the spirit and protection scope of the present application. Implementations of the present application may not necessarily include all parts or steps in the embodiments described in this specification, and an execution sequence of the steps may be adjusted according to an actual application.

FIG. 1 is a schematic structural diagram of a film deposition apparatus 100 according to some embodiments of the present application. As shown in FIG. 1, the film deposition apparatus 100 includes a chamber body 101, a cover plate 103, an insulation part 104, and top parts including a spray board 107. The chamber body 101, the cover plate 103, the insulation part 104, and the top parts including the spray board 107 together form a chamber of the film deposition apparatus 100. In a process of operating the film deposition apparatus 100 to deposit a film on a surface of a wafer, the chamber is sealed to form an internal space 102. The film deposition apparatus 100 further includes a wafer pocket 106 in the chamber. One or more heating elements may be disposed inside the wafer pocket 106 to heat a wafer placed on the wafer pocket 106. Therefore, the wafer pocket 106 may be alternatively referred to as a "heating plate". The wafer pocket 106 may be controlled to move upward and downward in the chamber by using a moving mechanism (not shown in FIG. 1) such as a motor. When a film is deposited, the wafer pocket 106 with a wafer placed thereon may be moved to a suitable working position to receive gas sprayed from the spray board 107.

As shown in FIG. 1, the film deposition apparatus 100 further includes a pumping part 108. The pumping part 108 is located in the internal space 102 and placed close to an inner side wall of the chamber body 101. As further described below, the pumping part 108 may include an essentially annular structure. However, the pumping part is not limited to the annular structure, but may alternatively have other shapes according to different shapes of the chamber body and/or different shapes of the wafer pocket. In some embodiments, the shape of the pumping part 108 is designed to meet a condition that the wafer pocket 106 will substantially not be shielded by the pumping part 108 when the pumping part 108 is above the wafer pocket 106. In some embodiments, the pumping part 108 may surround the wafer pocket 106.

As shown in FIG. 1, the film deposition apparatus 100 further includes a pumping pipe 109. The pumping pipe 109 partially extends into the internal space 102 of the chamber and is connected to the pumping part 108, and the pumping pipe 109 is in communication with the interior of the pumping part 108 to allow gas to pass. Another end of the pumping pipe 109 may be connected to a vent pipe 111 through a corrugated pipe 110 and be further connected to an extraction pump (not shown in FIG. 1). A portion of the pumping pipe 109 located outside the chamber may also be sleeved with a corrugated pipe similar to the corrugated pipe 110. Under the action of the extraction pump, gas in the internal space 102 may be transported to the outside of the chamber of the film deposition apparatus 100 through the pumping part 108, the pumping pipe 109, the corrugated pipe 110, and the vent pipe 111. A butterfly valve 112 and a gate valve 113 that are mounted on the vent pipe 111 may be used for controlling transportation of the gas (for example, adjusting a gas flow speed and controlling on-off of the vent pipe).

According to some embodiments of the present application, the pumping part 108 and the pumping pipe 109 may move upward and downward in the chamber, which may be implemented under driving of a first motor 120. As shown in FIG. 1, the first motor 120 is connected to one end of a first lead screw 122 through a coupler (not shown in FIG. 1), and the other end of the first lead screw 122 is connected (for example, through a ball bearing) to a bottom of the chamber body 101. A first slider 123 is assembled on the first lead screw 122. The first slider 123 is fixedly connected (for example, through a bolt) to a first fixing part 124. The first fixing part 124 is fixed (for example, through a bolt) to a lower end of the pumping pipe 109. When the first lead screw 122 rotates under the driving of the first motor 120, the first slider 123 may perform an upward or downward straight-line movement along the first lead screw 122 to further drive the first fixing part 124, the pumping pipe 109, and the pumping part 108 to ascend or descend together. It should be understood that, in other embodiments, the first motor 120 may drive the pumping pipe 109 to ascend or descend through other different drive mechanisms.

To enable the pumping part 108 to ascend or descend more stably, in some embodiments, a support bar 131 connected to the pumping part 108 may be disposed generally symmetrically to the pumping pipe 109. Different from the pumping pipe 109, the support bar 131 is not in communication with the interior of the pumping part 108. A portion of the support bar 131 located outside the chamber may also be sleeved with a corrugated pipe similar to the corrugated pipe 110. A second fixing part 134 is fixed to a lower end of the support bar 131. A second slider 133 is connected to the second fixing part 134 and assembled on a second lead screw 132. One end of the second lead screw 132 is connected to a second motor 130, and the other end is connected (for example, through a ball bearing) to the bottom of the chamber body 101. When the second lead screw 132 rotates under driving of the second motor 130, the second slider 133 may perform an upward or downward straight-line movement along the second lead screw 132 to further drive the second fixing part 134 and the support bar 131 to ascend or descend together. The second motor 130 and the first motor 120 may generally drive the second lead screw 132 and the first lead screw 122 synchronously, to make the second slider 133 and the first slider 123 to ascend or descend at a substantially same speed. In some embodiments, synchronization may be implemented by controlling rotation speeds of the first motor 120 and the second motor 130 by using a control module. In some other embodiments, one or more support bars connected to the pumping part 108 and corresponding motors and drive mechanisms may alternatively be disposed at other different positions.

Figure 2:
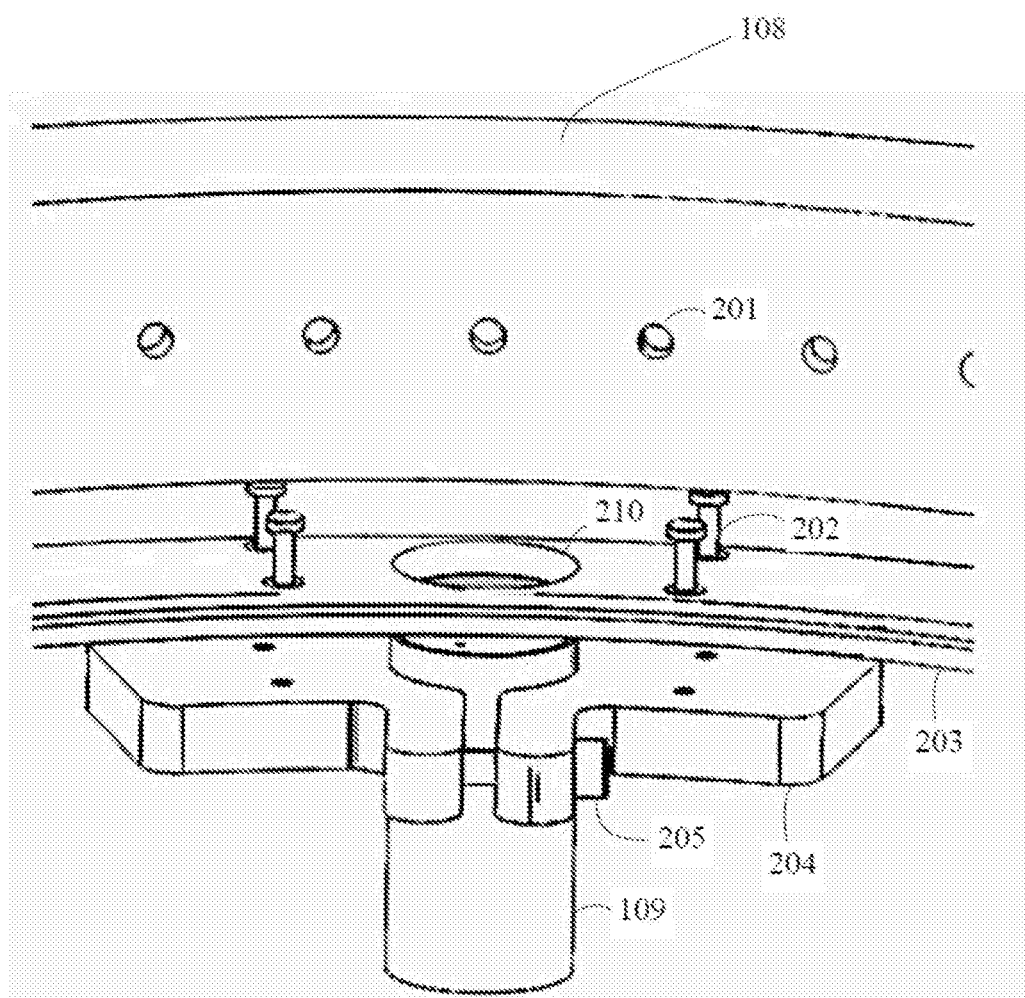
FIG. 2 is a local schematic structural diagram of a pumping part of the film deposition apparatus according to some embodiments of the present application.

FIG. 2 is a local schematic structural diagram of the pumping part 108 of the film deposition apparatus 100 according to some embodiments of the present application. Although only a portion of the pumping part 108 is shown in FIG. 2, a person skilled in the art may understand the entire structure of the pumping part 108 with reference to FIG. 1. As shown in FIG. 2, the pumping part 108 is an annular structure and has a curved inner surface, and a plurality of pumping holes 201 are provided on the inner surface.

A pumping base plate 203 is disposed below the pumping part 108, and a fixing flange 204 is disposed below the pumping base plate 203. The pumping part 108 may be placed on the pumping base plate 203, and the pumping base plate 203 is connected to the fixing flange 204 through one or more screws 202.

The fixing flange 204 is connected to the pumping pipe 109 through a flange screw 205. A hole 210 corresponding to the pumping pipe 109 is provided on the pumping base plate 203. When the film deposition apparatus 100 runs, gas in the internal space 102 may enter into the pumping part 108 through the plurality of pumping holes 201 circumferentially distributed, accumulate and enter the pumping pipe 109 through the hole 210, and be further emitted to the outside of the chamber of the film deposition apparatus 100. It should be understood that, the structure shown in FIG. 2 is merely for the purpose of exemplary description, and the pumping part 108 may alternatively be connected to the pumping pipe 109 by using other connection manners and connection mechanisms without departing from the spirit and scope of the present application.

A pumping process of the film deposition apparatus 100 is described below with reference to FIG. 1 and FIG. 2. When a deposition process is performed, the spray board 107 sprays gas toward the wafer on the wafer pocket 106. Under the action of an extraction pump, the gas inside the chamber may have the gas flow field distribution indicated by the arrows 112 in FIG. 1. Specifically, the gas inside the chamber may be pumped into the plurality of pumping holes 201 of the pumping part 108. The pumping part 108 has a curved inner surface and the plurality of pumping holes 201 are generally distributed along an entire circumference of the curved inner surface, so that the gas around the wafer pocket 106 may be collected by the pumping part 108 along a direction indicated by the arrows 112, and be further emitted to the outside of the chamber through the pumping pipe 109 (as shown by the arrows in the pumping pipe 109).

As mentioned above, the existing deposition apparatus cannot effectively adjust the edge trend of the profile of the film, for example, cannot effectively adjust an edge thickness of the film. Some embodiments of the present application provide a film deposition apparatus (for example, the film deposition apparatus 100) capable of adjusting a position of the pumping part in the chamber. The apparatus may adjust a gas flow field inside the chamber by adjusting relative positions of the pumping part and the wafer, to further adjust an edge trend of a profile of a deposited film.

Figure 3:
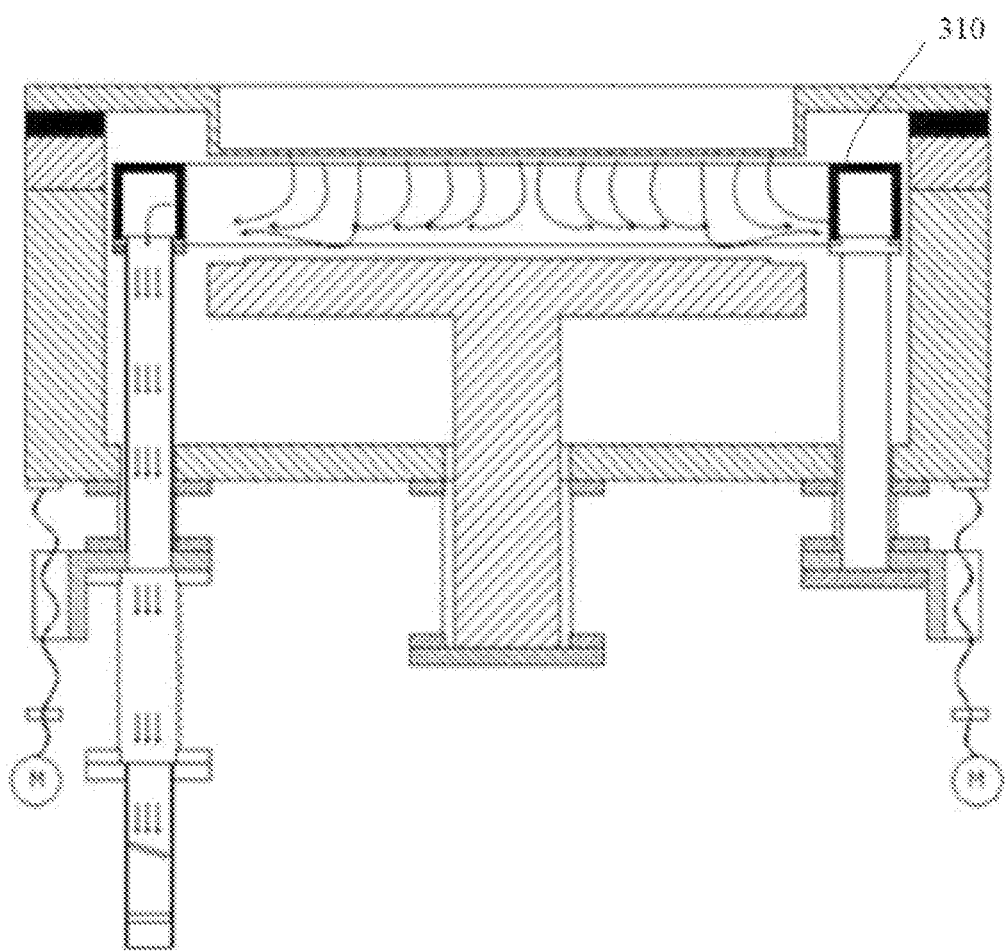
FIG. 3 and FIG. 4 are schematic diagrams of a pumping part at a highest position and a lowest position in a chamber of a film deposition apparatus according to some embodiments of the present application.
Figure 4:
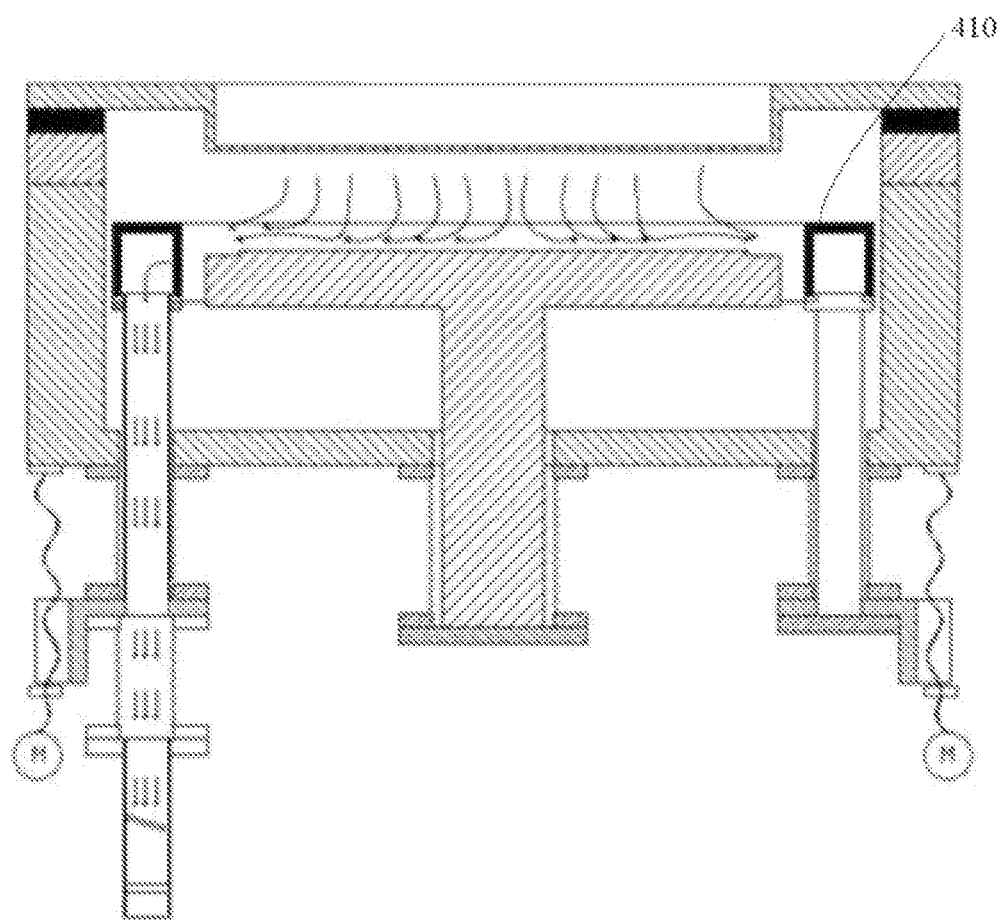

FIG. 3 and FIG. 4 are schematic diagrams of a pumping part at a highest position 310 and a lowest position 410 in a chamber of a film deposition apparatus according to some embodiments of the present application. The film deposition apparatus in FIG. 3 and FIG. 4 may include the film deposition apparatus 100 shown in FIG. 1, and reference numerals of parts that are the same as those in FIG. 1 have been omitted. The pumping part (for example, the pumping part 108) may move between the highest position 310 and the lowest position 410. In examples of FIG. 3 and FIG. 4, a working position of a wafer pocket (for example, the wafer pocket 106) is maintained unchanged.

As shown in FIG. 3, under driving of a first motor (for example, the first motor 120) and a second motor (for example, the second motor 130), the pumping part may ascend to the highest position 310. The highest position 310 of the pumping part may be almost in contact with a top of the chamber. For example, an upper surface of the pumping part may be close to a lower surface of a spray board (for example, the spray board 107). In this case, a corrugated pipe (for example, the corrugated pipe 110) is stretched to allow a larger portion of a pumping pipe to enter into the chamber.

As shown in FIG. 4, under the driving of the first motor (for example, the first motor 120) and the second motor (for example, the second motor 130), the pumping part may descend to the lowest position 410. The lowest position 410 of the pumping part may be generally flush with a horizontal plane on which the wafer pocket is located. For example, the upper surface (or a lower surface) of the pumping part may be generally located in a same horizontal plane with an upper surface (or a lower surface) of the wafer pocket. In this case, the corrugated pipe (for example, the corrugated pipe 110) is compressed to allow a smaller portion of the pumping pipe to enter into the chamber.

The highest position 310 and the lowest position 410 of the pumping part shown in FIG. 3 and FIG. 4 are merely for the purpose of exemplary description. Different highest positions and/or lowest positions may be set according to requirements of actual processes. According to another embodiment of the present application, the lowest position of the pumping part may be located below the wafer pocket. For example, the lower surface of the pumping part may be close to a bottom surface of the chamber. In other words, the pumping part may be located at a top or a bottom of the chamber, and located above or below the wafer pocket.

As shown in FIG. 3 and FIG. 4, when the relative positions of the pumping part and the wafer pocket change, the gas flow field inside the chamber may change accordingly. When the pumping part is located at the highest position 310, the pumping part extracts, at a relatively high position, gas above an edge of the wafer pocket (corresponding to an edge of a deposited film), and when the pumping part is located at the lowest position 410, the pumping part extracts, at a relatively low position, gas above the edge of the wafer pocket. The gas flow field inside the chamber may be changed by changing a position of the pumping part relative to the wafer pocket, to further adjust an edge trend of the profile of the film deposited on the wafer.

Figure 5:
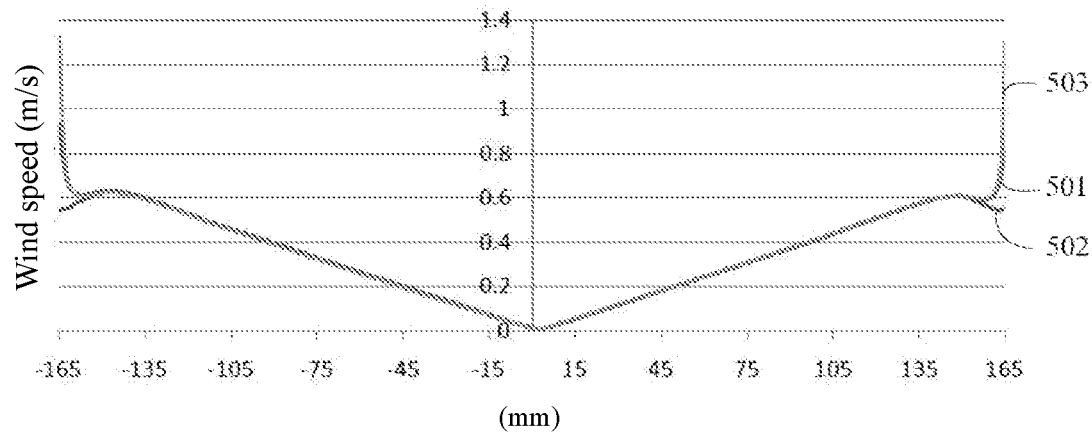
FIG. 5 is a simulation diagram of wind speed curves of gas flow fields formed when the pumping part is at different positions in the chamber of the film deposition apparatus according to some embodiments of the present application.

FIG. 5 shows a simulation diagram of wind speed curves of gas flow fields formed when the pumping part (for example, the pumping part 108) is at different positions in the chamber of the film deposition apparatus (for example, the film deposition apparatus 100) according to some embodiments of the present application. In the diagram, a horizontal coordinate represents a distance to a center of the wafer pocket (for example, the wafer pocket 106), a vertical coordinate represents a wind speed, a curve 501 represents wind speeds at various places of a surface of the wafer pocket when the pumping part is located at an original position, a curve 502 represents wind speeds at various places of the surface of the wafer pocket when the pumping part moves upward by 14 mm relative to the original position, and a curve 503 represents wind speeds at various places of the surface of the wafer pocket when the pumping part moves downward by 14 mm relative to the original position.

As shown in FIG. 5, the curves 501, 502 and 503 almost overlap with each other within a range of a center (corresponding to a center of the film) region of the wafer pocket (for example, a range from a horizontal coordinate −150 mm to a horizontal coordinate 150 mm) In other words, the upward movement and downward movement of the pumping part have nearly no effect on the gas flow field of the center region of the film. However, the curve 502 obviously declines relative to the curve 501 within an edge region of the film (for example, a range from a horizontal coordinate 150 mm to a horizontal coordinate 165 mm), and the curve 503 also changes relative to the curve 501 within the edge region of the film. In other words, the simulation result shown in FIG. 5 indicates that the upward movement and downward movement of the pumping part affect a gas flow field of the edge region of the film. The change of the gas flow field of the edge region of the film further affects a thickness of an edge of the deposited film.

Figure 6:
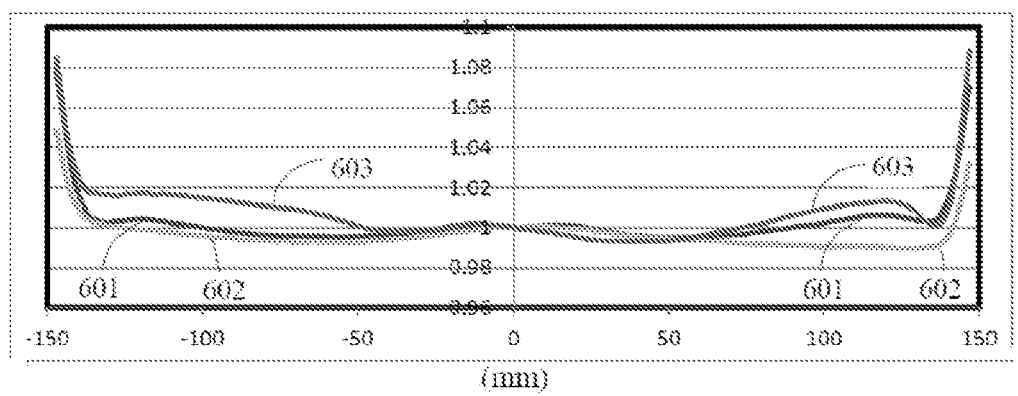
FIG. 6 is a diagram of thickness curves of films formed when the pumping part is at different positions in the chamber of the film deposition apparatus according to some embodiments of the present application.

FIG. 6 is a diagram of thicknesses curves of films formed when the pumping part (for example, the pumping part 108) is at different positions in the chamber of the film deposition apparatus (for example, the film deposition apparatus 100) according to some embodiments of the present application. In the diagram, a horizontal coordinate represents a distance to the center of the wafer pocket (for example, the wafer pocket 106), a vertical coordinate represents a relative thickness of the film (a thickness of a center of the film is set to 1), a curve 601 represents thicknesses at various positions of the deposited film when the pumping part is located at an original position, a curve 602 represents thicknesses at various positions of the deposited film when the pumping part moves upward by 14 mm relative to the original position, and a curve 603 represents thicknesses at various positions of the deposited film when the pumping part moves downward by 14 mm relative to the original position. The curves 601, 602 and 603 are obtained through measurement by only adjusting the position of the pumping part in the chamber while other process parameters are the same.

It may be seen by comparing the curves 601, 602 and 603 that, when the pumping part moves upward, the thickness of the edge of the film (for example, within a range from a horizontal coordinate 100 mm to a horizontal coordinate 150 mm) is in a descending trend, and on the contrary, when the pumping part moves downward, the thickness of the edge of the film is in an ascending trend. As shown in FIG. 6, when the pumping part moves upward by 14 mm relative to the original position, the thickness of the edge of the film is reduced by about 2% to 3%.

According to another embodiment of the present application, when the working position of the wafer pocket needs to be adjusted to adjust the profile of the film, the pumping part may ascend or descend together with the wafer pocket, to prevent the profile of the film from being affected by both radio frequency impedance and the gas flow field. Referring to FIG. 1, the wafer pocket 106 may ascend or descend to a new working position in the chamber under driving of a third motor (not shown in the figure), and the pumping part 108 may ascend or descend generally synchronously with the wafer pocket 106 under driving of the first motor 120 and the second motor 130. In some embodiments, synchronization may be implemented by controlling rotation speeds of the first motor 120, the second motor 130, and the third motor by using a control module. According to the foregoing configuration, when the working position of the wafer pocket 106 is adjusted, the relative positions between the pumping part 108 and the wafer pocket 106 may be maintained unchanged, so that the change of the gas flow field may be reduced or eliminated, and the profile of the film is only subject to a single variable, namely, the radio frequency impedance.

Figure 7:
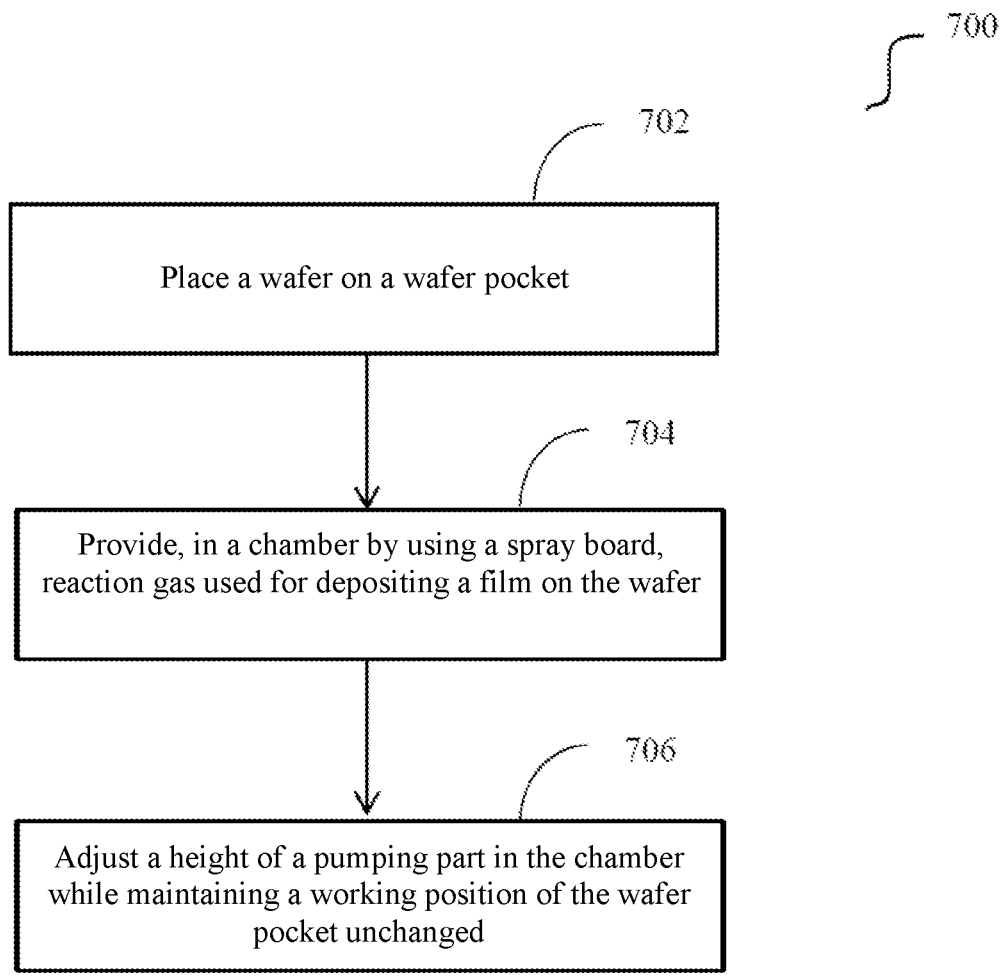
FIG. 7 is a flowchart of an exemplary method of operating the film deposition apparatus according to some embodiments of the present application.

FIG. 7 shows a flowchart of an exemplary method 700 of operating the film deposition apparatus according to some embodiments of the present application. According to embodiments of the present application, the film deposition apparatus configured to perform the method 700 may include the film deposition apparatus shown in FIG. 1 to FIG. 4 as described above or an apparatus having similar functions. In step 702, a wafer is placed on a wafer pocket of the film deposition apparatus, and the wafer pocket is moved to a working position by controlling a motor connected to the wafer pocket. A pumping part of the film deposition apparatus may be moved to a first height by controlling a motor (for example, the first motor 120) connected to the pumping part. In step 704, reaction gas used for depositing a film on the wafer is provided in a chamber of the film deposition apparatus by using a spray board. In step 706, a height of the pumping part in the chamber is adjusted (for example, moving the pumping part to a second height different from the first height) by controlling the motor (for example, the first motor 120) connected to the pumping part, and the working position of the wafer pocket is maintained unchanged while the pumping part is moved. In some embodiments, step 706 may include adjusting the height of the pumping part in the chamber to cause the pumping part to move to be located above or below the wafer pocket, or to be located in a same horizontal plane with the wafer pocket. In some embodiments, step 706 may include adjusting the height of the pumping part in the chamber to make an upper surface of the pumping part close to a lower surface of the spray board. In some embodiments, step 706 may include adjusting the height of the pumping part in the chamber to make a lower surface of the pumping part close to a bottom surface of the chamber.

The method 700 implements adjustment of the gas flow field in the chamber by adjusting the relative positions between the pumping part and the wafer pocket, to adjust an edge trend of a profile of a deposited film, where adjustment of the gas flow field in the chamber includes adjusting a gas flow field around an edge of the film.

Figure 8:
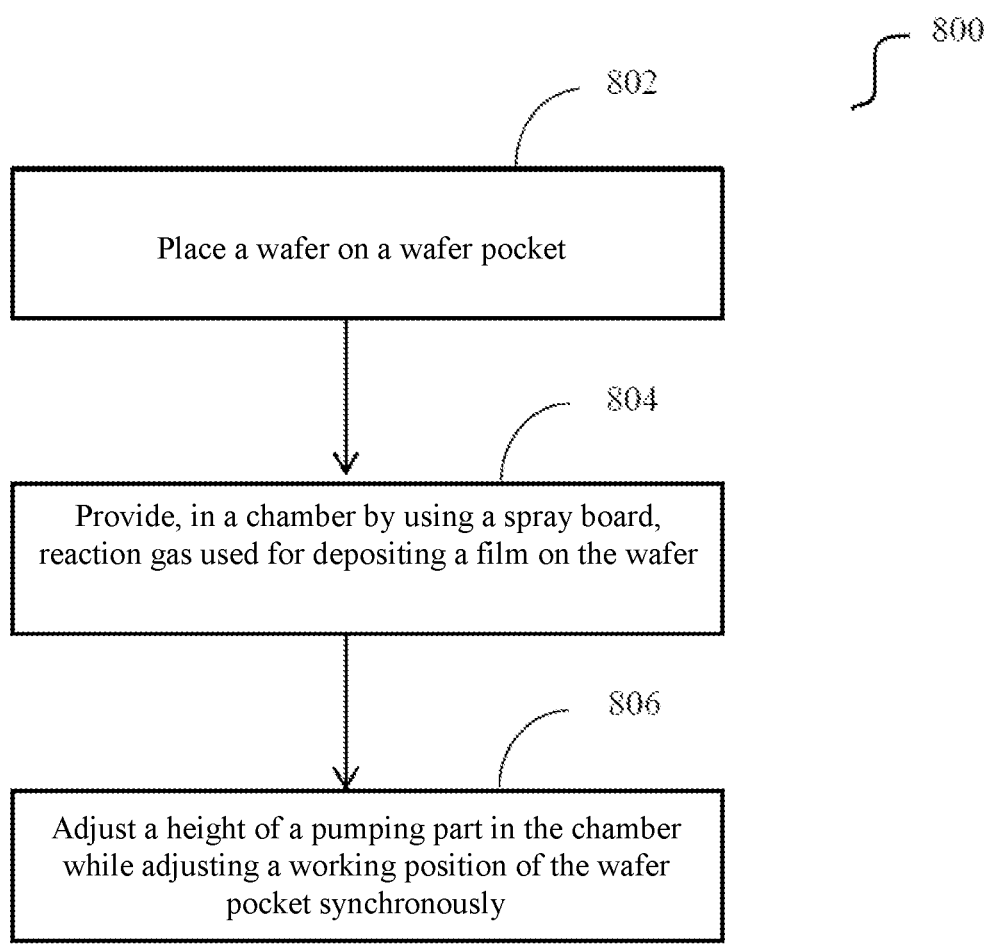
FIG. 8 is a flowchart of an exemplary method of operating the film deposition apparatus according to some other embodiments of the present application.

FIG. 8 shows a flowchart of an exemplary method 800 of operating the film deposition apparatus according to some other embodiments of the present application. According to embodiments of the present application, the film deposition apparatus configured to perform the method 800 may include the film deposition apparatus shown in FIG. 1 to FIG. 4 as described above or an apparatus having similar functions. In step 802, a wafer is placed on a wafer pocket of the film deposition apparatus, and the wafer pocket is moved to a first working position by controlling a motor connected to the wafer pocket. A pumping part of the film deposition apparatus may be moved to a first height by controlling a motor (for example, the first motor 120) connected to the pumping part. In step 804, reaction gas used for depositing a film on the wafer is provided in a chamber of the film deposition apparatus by using a spray board. In step 806, the working position of the wafer pocket is adjusted by controlling the motor connected to the wafer pocket, and the height of the pumping part in the chamber may be synchronously adjusted by controlling the motor (for example, the first motor 120) connected to the pumping part at the same time. For example, the wafer pocket may be moved to a second working position different from the first working position by controlling the motor connected to the wafer pocket, and the pumping part is synchronously moved to a second height different from the first height by controlling the motor (for example, the first motor 120) connected to the pumping part at the same time, so that the relative positions between the wafer pocket and the pumping part are substantially unchanged.

The method 800 ensures the wafer pocket and the pumping part to remain static relative to each other when the working position of the wafer pocket is moved, so that there is only one single variable, namely, the radio frequency impedance, in a film deposition process, thereby eliminating the impact of the change of the gas flow field on the thickness of the film.

According to embodiments of the present application, the film deposition apparatus and method of the present application may effectively control the thickness of the edge of the film in the film deposition process and adjust the edge trend of the profile of the film in a single station form, thereby increasing a process adjustment window and improving process production quality and efficiency.

The description in this specification is provided for a person skilled in the art to perform or use the present application. Various modifications to the present application will be easily and obviously made by a person skilled in the art, and the general principles defined in this specification may be applied to other variation forms without departing from the spirit or scope of the present application. Therefore, the present application is not limited to the examples and designs described in this specification, but is granted a widest range consistent with the principles and novel features disclosed in this specification.

What is claimed is:

1. A film deposition apparatus, comprising:
a chamber;
a spray board arranged at a top of the chamber;
a wafer pocket arranged opposite to the spray board in the chamber;
a pumping part arranged adjacent to an inner side wall of the chamber, wherein the pumping part is configured to ascend or descend in the chamber under driving of a first motor;
a pumping pipe, wherein the pumping pipe is partially located in the chamber and is connected to the pumping part, and the pumping pipe is in communication with an interior of the pumping part; and
a pumping base plate, wherein the pumping part is arranged on the pumping base plate, and the pumping base plate is fixedly connected to the pumping pipe and is provided with a hole corresponding to the pumping pipe, wherein
the pumping base plate is connected to a fixing flange through a screw, and the fixing flange is connected to the pumping pipe through a flange screw.

2. The film deposition apparatus according to claim 1, wherein the pumping part is annular.

3. The film deposition apparatus according to claim 1, wherein a plurality of pumping holes are provided on an inner surface of the pumping part, and the plurality of pumping holes are generally distributed along a circumference of the inner surface.

4. The film deposition apparatus according to claim 1, wherein the pumping part is configured to move to be located above or below the wafer pocket, or to be located in a same horizontal plane with the wafer pocket under the driving of the first motor.

5. The film deposition apparatus according to claim 1, wherein the pumping part is configured to make an upper surface of the pumping part adjacent to a lower surface of the spray board under the driving of the first motor.

6. The film deposition apparatus according to claim 1, wherein the pumping part is configured to make a lower surface of the pumping part adjacent to a bottom surface of the chamber under the driving of the first motor.

7. The film deposition apparatus according to claim 1, wherein the wafer pocket is configured to ascend or descend in the chamber under driving of a third motor.

8. A film deposition apparatus, comprising:
a chamber;
a spray board arranged at a top of the chamber;
a wafer pocket arranged opposite to the spray board in the chamber; and
a pumping part arranged adjacent to an inner side wall of the chamber, wherein the pumping part is configured to ascend or descend in the chamber under driving of a first motor;
a pumping pipe, wherein the pumping pipe is partially located in the chamber and is connected to the pumping part, and the pumping pipe is in communication with an interior of the pumping part;
a lead screw connected to the first motor and a slider assembled on the lead screw, wherein the slider is fixedly connected to the pumping pipe.

9. The film deposition apparatus according to claim 8, wherein the slider is connected to the pumping pipe through a fixing part.

10. A film deposition apparatus, comprising:
a chamber;
a spray board arranged at a top of the chamber;
a wafer pocket arranged opposite to the spray board in the chamber; and
a pumping part arranged adjacent to an inner side wall of the chamber, wherein the pumping part is configured to ascend or descend in the chamber under driving of a first motor;
a pumping pipe, wherein the pumping pipe is partially located in the chamber and is connected to the pumping part, and the pumping pipe is in communication with an interior of the pumping part;
a support bar, wherein the support bar is partially located in the chamber and is connected to the pumping part, and the support bar is not in communication with the interior of the pumping part.

11. The film deposition apparatus according to claim 10, further comprising a lead screw connected to a second motor and a slider assembled on the lead screw, wherein the slider is fixedly connected to the support bar.

12. The film deposition apparatus according to claim 11, wherein the second motor is configured to run generally synchronously with the first motor.

13. A method of operating the film deposition apparatus according to claim 1, the method comprising:
placing a wafer on the wafer pocket;
providing, in the chamber by using the spray board, reaction gas used for depositing a film on the wafer; and
adjusting a height of the pumping part in the chamber by controlling the first motor.

14. The method according to claim 13, wherein a working position of the wafer pocket is maintained unchanged while the height of the pumping part in the chamber is adjusted.

15. The method according to claim 13, wherein adjusting the height of the pumping part in the chamber comprises adjusting the height of the pumping part in the chamber to cause the pumping part to move to be located above or below the wafer pocket, or to be located in a same horizontal plane with the wafer pocket.

16. The method according to claim 13, wherein adjusting the height of the pumping part in the chamber comprises adjusting the height of the pumping part in the chamber to make an upper surface of the pumping part adjacent to a lower surface of the spray board.

17. The method according to claim 13, wherein adjusting the height of the pumping part in the chamber comprises adjusting the height of the pumping part in the chamber to make a lower surface of the pumping part adjacent to a bottom surface of the chamber.

18. The method according to claim 13, wherein adjusting the height of the pumping part in the chamber comprises adjusting the height of the pumping part in the chamber while adjusting a working position of the wafer pocket synchronously, to make relative positions between the wafer pocket and the pumping part substantially unchanged.

* * * * *